US011805644B2

(12) United States Patent
Chen et al.

(10) Patent No.: US 11,805,644 B2
(45) Date of Patent: Oct. 31, 2023

(54) MANUFACTURING METHOD OF MEMORY DEVICE

(71) Applicant: Winbond Electronics Corp., Taichung (TW)

(72) Inventors: Jian-Ting Chen, Taichung (TW); Yao-Ting Tsai, Taichung (TW); Hsiu-Han Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 119 days.

(21) Appl. No.: 17/567,850

(22) Filed: Jan. 3, 2022

(65) Prior Publication Data

US 2022/0123007 A1    Apr. 21, 2022

Related U.S. Application Data

(62) Division of application No. 16/568,297, filed on Sep. 12, 2019, now Pat. No. 11,257,833.

(30) Foreign Application Priority Data

Feb. 26, 2019   (TW) .................................. 108106386

(51) Int. Cl.
*H01L 27/11556*   (2017.01)
*H10B 41/27*      (2023.01)
(Continued)

(52) U.S. Cl.
CPC ..... *H10B 41/27* (2023.02); *H01L 21/823437* (2013.01); *H01L 29/66825* (2013.01); *H01L 29/788* (2013.01)

(58) Field of Classification Search
CPC ... H01L 29/792–7926; H01L 29/66833; H01L 29/51–518; H01L 29/66719; H01L 29/66689; H01L 21/823864; H01L 21/823468; H01L 21/28132–2815; H01L 29/6656; H01L 29/66553; H01L 29/6653;
(Continued)

(56) References Cited

U.S. PATENT DOCUMENTS 4,507,673 A * 3/1985 Aoyama ................. H01L 29/51
                                                        257/77
5,291,048 A * 3/1994 Nakao .................... H01L 29/518
                                                        257/E21.423
(Continued)

FOREIGN PATENT DOCUMENTS

| JP | 2004186319 A | * | 7/2004 |
| JP | 2009027082 A | * | 2/2009 |
| KR | 20090022120 A | * | 3/2009 |

*Primary Examiner* — Jarrett J Stark
(74) *Attorney, Agent, or Firm* — JCIPRNET

(57) ABSTRACT

Provided is a manufacturing method of a memory device, including: forming a stacked layer on a substrate; patterning the stacked layer to form a plurality of openings in the stacked layer; forming a spacer on a sidewall of the openings; performing a first etching process by using the spacer as a mask to form a plurality of stack structures, wherein the spacer is embedded in the stack structures, such that a width of an upper portion of the stack structures is less than a width of a lower portion thereof; forming a dielectric layer on the stack structures and the spacer; and respectively forming a plurality of contact plugs on the substrate between the stack structures.

17 Claims, 11 Drawing Sheets

(51) Int. Cl.
*H01L 29/788* (2006.01)
*H01L 29/66* (2006.01)
*H01L 21/8234* (2006.01)

(58) Field of Classification Search
CPC . H01L 29/42324–42336; H01L 29/788–7889; H01L 29/4983; G11C 2216/06–10
See application file for complete search history.

(56) References Cited

U.S. PATENT DOCUMENTS

| | | | | |
|---|---|---|---|---|
| 5,838,041 A * | 11/1998 | Sakagami | H01L 21/2815 | 257/326 |
| 5,895,239 A * | 4/1999 | Jeng | H10B 12/033 | 257/E21.654 |
| 6,071,751 A * | 6/2000 | Wallace | H01L 21/3003 | 257/608 |
| 6,101,131 A * | 8/2000 | Chang | H01L 29/42328 | 257/E27.081 |
| 6,228,731 B1 * | 5/2001 | Liaw | H01L 21/76831 | 257/E21.507 |
| 6,232,185 B1 * | 5/2001 | Wang | H01L 29/40114 | 438/257 |
| 6,255,205 B1 * | 7/2001 | Sung | H10B 69/00 | 438/266 |
| 6,262,451 B1 * | 7/2001 | Huang | H01L 21/2815 | 257/547 |
| 6,287,957 B1 * | 9/2001 | Linliu | H01L 21/76897 | 257/E21.507 |
| 6,365,455 B1 * | 4/2002 | Su | H10B 41/30 | 438/257 |
| 6,448,140 B1 * | 9/2002 | Liaw | H01L 21/28114 | 257/E21.507 |
| 6,518,618 B1 * | 2/2003 | Fazio | H10B 69/00 | 257/E21.507 |
| 6,559,007 B1 * | 5/2003 | Weimer | H01L 29/513 | 438/257 |
| 6,930,003 B2 * | 8/2005 | Yamamukai | H10B 43/30 | 257/E21.21 |
| 7,001,807 B1 * | 2/2006 | Zheng | H01L 29/7923 | 257/E21.21 |
| 7,072,210 B2 * | 7/2006 | Jeng | H10B 20/00 | 365/185.26 |
| 7,189,618 B2 * | 3/2007 | Lee | H01L 29/512 | 257/E21.422 |
| 7,482,236 B2 * | 1/2009 | Lee | H01L 21/823864 | 438/303 |
| 7,638,835 B2 * | 12/2009 | Irani | H10B 43/40 | 257/411 |
| 7,781,282 B2 * | 8/2010 | Yoo | H01L 21/76895 | 438/266 |
| 7,973,356 B2 * | 7/2011 | Kikuchi | H01L 29/6656 | 257/326 |
| 8,258,039 B2 * | 9/2012 | Inoue | H01L 28/60 | 257/305 |
| 8,455,952 B2 * | 6/2013 | Lin | H01L 21/823468 | 438/300 |
| 8,546,866 B2 * | 10/2013 | Nagai | H01L 29/792 | 257/316 |
| 8,912,610 B2 * | 12/2014 | Lin | H01L 21/28088 | 257/407 |
| 9,136,129 B2 * | 9/2015 | Perera | H01L 29/66545 | |
| 9,263,556 B2 * | 2/2016 | Hsieh | H01L 29/7853 | |
| 9,269,609 B2 * | 2/2016 | Shue | H01L 21/76283 | |
| 9,391,151 B2 * | 7/2016 | Wu | H01L 29/7881 | |
| 9,412,859 B2 * | 8/2016 | Richter | H01L 29/66575 | |
| 9,543,511 B2 * | 1/2017 | Sung | H10N 70/063 | |
| 9,553,129 B2 * | 1/2017 | Jiang | H01L 23/544 | |
| 9,812,460 B1 * | 11/2017 | Wu | H01L 29/6656 | |
| 9,859,290 B1 * | 1/2018 | Wang | H01L 29/4966 | |
| 9,859,417 B2 * | 1/2018 | Hsiao | H01L 29/518 | |
| 2003/0003657 A1 * | 1/2003 | Kim | H01L 29/40114 | 438/257 |
| 2006/0270186 A1 * | 11/2006 | Tsunomura | H01L 29/42324 | 257/E29.302 |
| 2008/0197403 A1 * | 8/2008 | Ozawa | H01L 29/40114 | 257/E29.302 |
| 2009/0065847 A1 * | 3/2009 | Lee | H10B 99/00 | 257/E29.001 |
| 2009/0246932 A1 * | 10/2009 | Kamioka | H10B 41/30 | 257/E21.573 |
| 2010/0308420 A1 * | 12/2010 | Usujima | H01L 21/823456 | 257/E21.409 |
| 2011/0006355 A1 * | 1/2011 | Shen | H10B 41/30 | 257/316 |
| 2011/0186797 A1 * | 8/2011 | Herner | H10B 63/84 | 257/E47.001 |
| 2012/0243339 A1 * | 9/2012 | Seo | G11C 16/0483 | 257/315 |
| 2013/0078791 A1 * | 3/2013 | Xie | H01L 21/32135 | 438/585 |
| 2014/0225176 A1 * | 8/2014 | Cheek | H01L 29/4916 | 257/314 |
| 2015/0333173 A1 * | 11/2015 | Wu | H01L 29/788 | 257/320 |
| 2015/0372121 A1 * | 12/2015 | Chen | H01L 29/7883 | 438/593 |
| 2016/0071947 A1 * | 3/2016 | Wiatr | H01L 29/516 | 257/295 |
| 2018/0182631 A1 * | 6/2018 | Kumagae | H01L 29/792 | |
| 2018/0366478 A1 * | 12/2018 | Yi | H01L 29/42336 | |
| 2019/0164987 A1 * | 5/2019 | Singh | H01L 29/792 | |
| 2020/0152647 A1 * | 5/2020 | Ni | G11C 5/063 | |
| 2020/0343256 A1 * | 10/2020 | Tsai | H01L 29/6659 | |
| 2021/0043638 A1 * | 2/2021 | Lin | H01L 21/823462 | |
| 2023/0099289 A1 * | 3/2023 | Chen | H01L 29/0649 | 257/368 |

* cited by examiner

MANUFACTURING METHOD OF MEMORY DEVICE

CROSS-REFERENCE TO RELATED APPLICATION

This application is a divisional application of and claims the priority benefit of U.S. application Ser. No. 16/568,297, filed on Sep. 12, 2019, now allowed, which claims the priority benefit of Taiwan application serial no. 108106386, filed on Feb. 26, 2019. The entirety of each of the above-mentioned patent applications is hereby incorporated by reference herein and made a part of this specification.

BACKGROUND OF THE INVENTION

Field of the Invention

The invention relates to a semiconductor device and a manufacturing method thereof, and more particularly, to a memory device and a manufacturing method thereof.

Description of Related Art

With the advancement of semiconductor techniques, the size of semiconductor memory devices has become smaller and smaller, which has led to an increase in the integration of semiconductor memory devices, thereby integrating more functional devices on the same chip. In this case, the linewidth in the semiconductor memory devices is also gradually reduced, so that the electronic product may be lightweight and compact. However, as the linewidth in devices gets smaller, semiconductor process techniques will face many challenges.

SUMMARY OF THE INVENTION

The invention provides a memory device having a spacer embedded in stack structures and a dielectric layer conformally covering to the stack structures to achieve the effect of dual protection.

The invention provides a manufacturing method of a memory device in which a spacer is embedded in the stack structures to increase the protection of an upper portion of the stack structures, thereby improving the process margin during a gate replacement process.

The invention provides a manufacturing method of a memory device including the following steps. A stacked layer is formed on a substrate; the stacked layer is patterned to form a plurality of openings in the stacked layer; a spacer is formed on a sidewall of the openings; a first etching process is performed by using the spacer as a mask to form a plurality of stack structures, wherein the spacer is embedded in the stack structures, such that a width of an upper portion of the stack structures is less than a width of a lower portion thereof; a dielectric layer is formed on the stack structures and the spacer; and a plurality of contact plugs are formed on the substrate between the stack structures.

In an embodiment of the invention, before the dielectric layer is formed, the manufacturing method of the memory device further includes performing an in-situ steam generation process to form an oxide layer on the sidewall of the stack structures, wherein a thickness of the oxide layer located on the sidewall of the upper portion of the stack structures is less than a thickness of the oxide layer located on the sidewall of the lower portion of the stack structures.

In an embodiment of the invention, the forming the contact plugs includes the following steps. A first conductive material is formed on the substrate to be filled in the space between the stack structures. The first conductive material is patterned into a plurality of conductive layers. A replacement process is performed to replace the conductive layer with the contact plugs.

In an embodiment of the invention, the replacement process further includes the following steps. A second etching process is performed to remove the conductive layers, so as to respectively form a plurality of contact openings between the stack structures, wherein the contact openings expose the substrate. A second conductive material is filled in the contact openings to form the plurality of contact plugs.

In an embodiment of the invention, the first conductive material is different from the second conductive material.

Based on the above, in the present embodiment, the spacer is embedded in the stack structures, and then the dielectric layer is formed to conformally cover the stack structures. In this case, the spacer and the dielectric layer may form a dual protection to increase the protection of the upper portion of the stack structures, thereby improving the process margin during a gate replacement process.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1K are cross sections of a manufacturing process of a memory device of an embodiment of the invention.

Figure 1A:
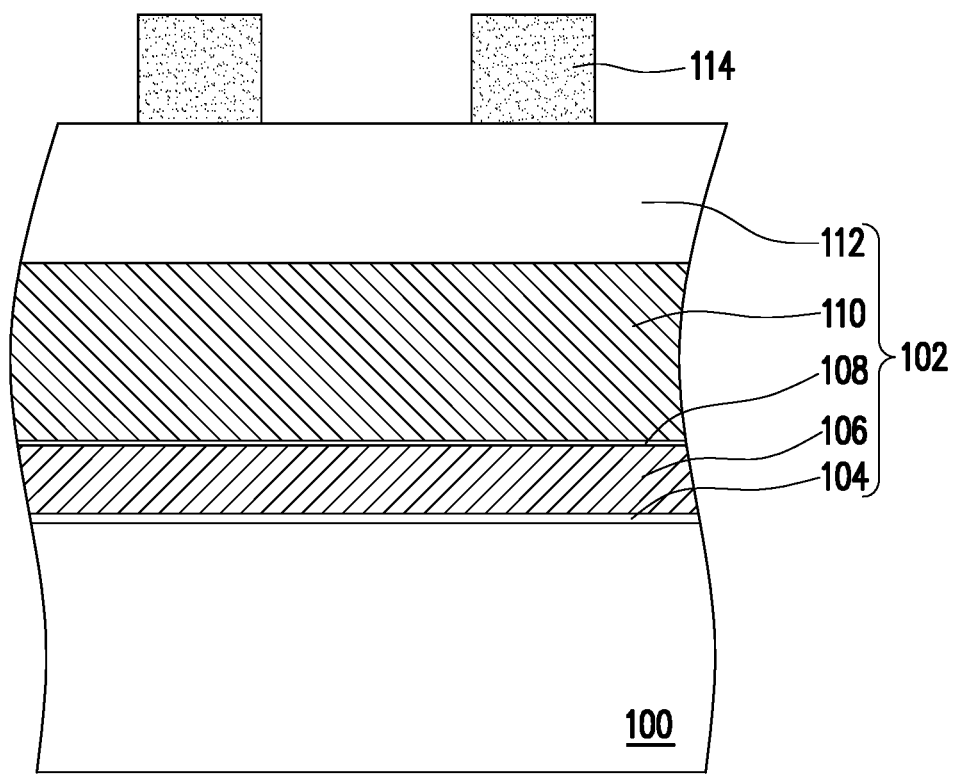
FIG. 1A to FIG. 1K are cross sections of a manufacturing process of a memory device of an embodiment of the invention.
Figure 1B:
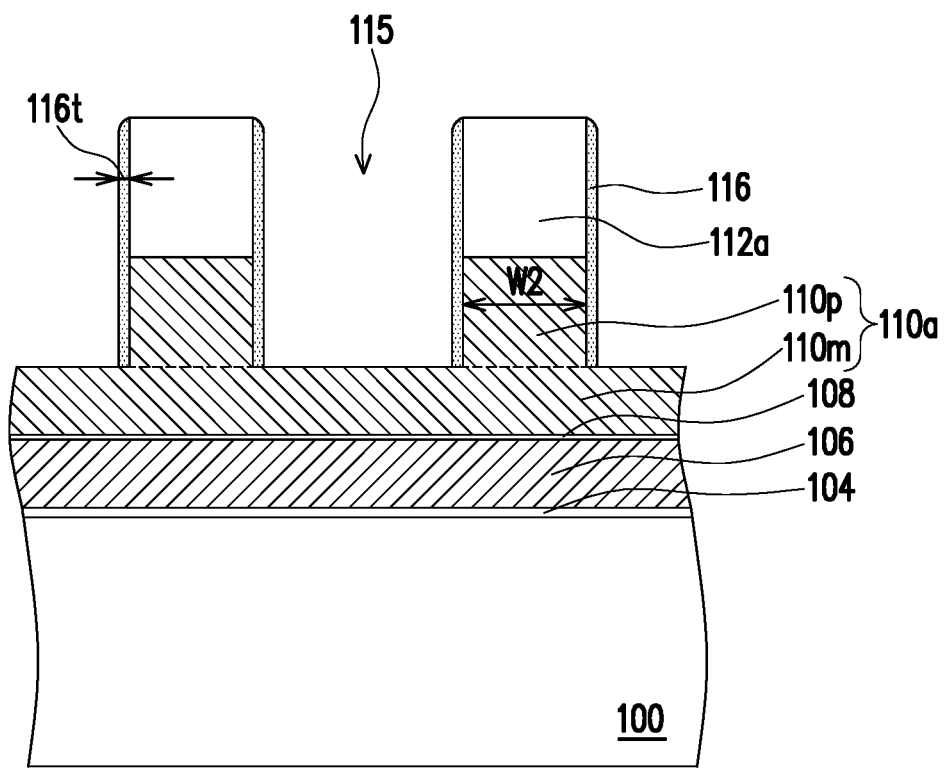
Figure 1C:
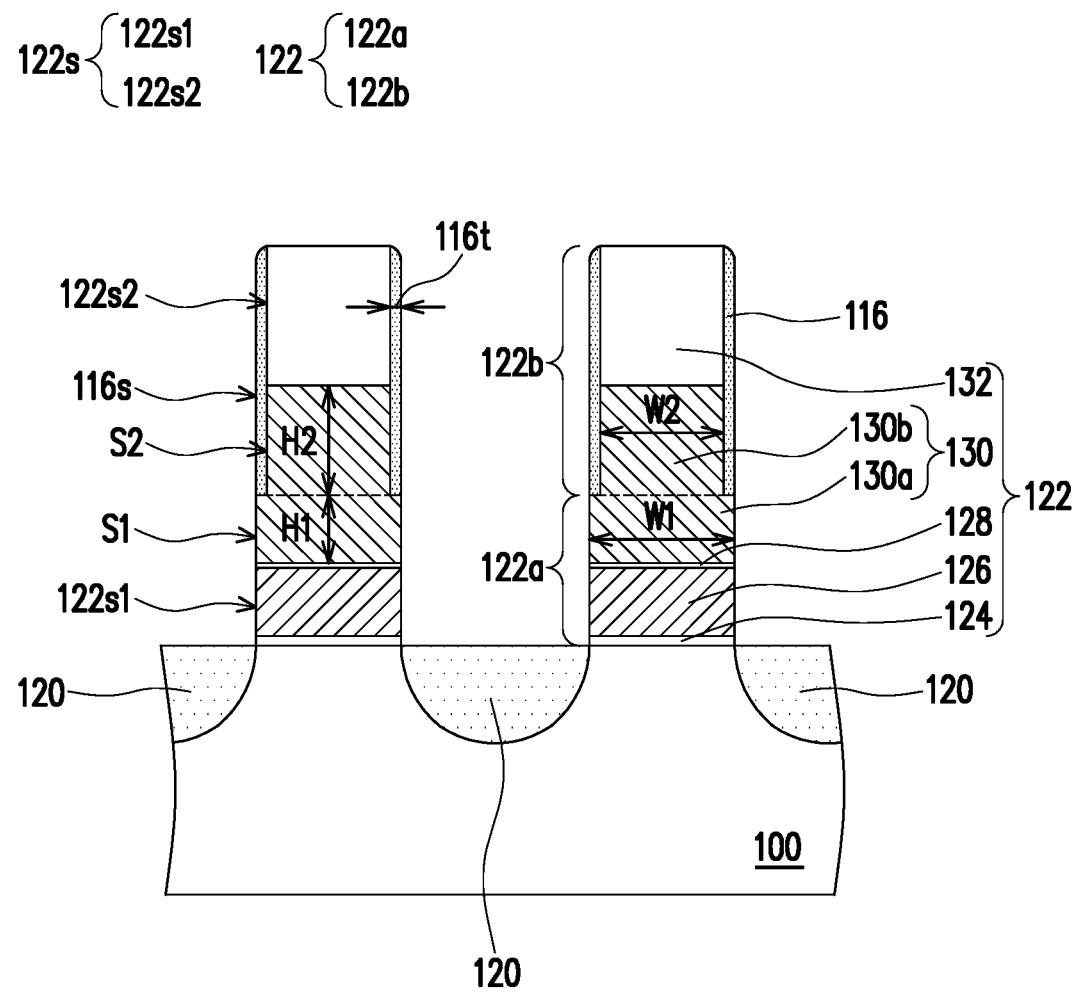
Figure 1D:
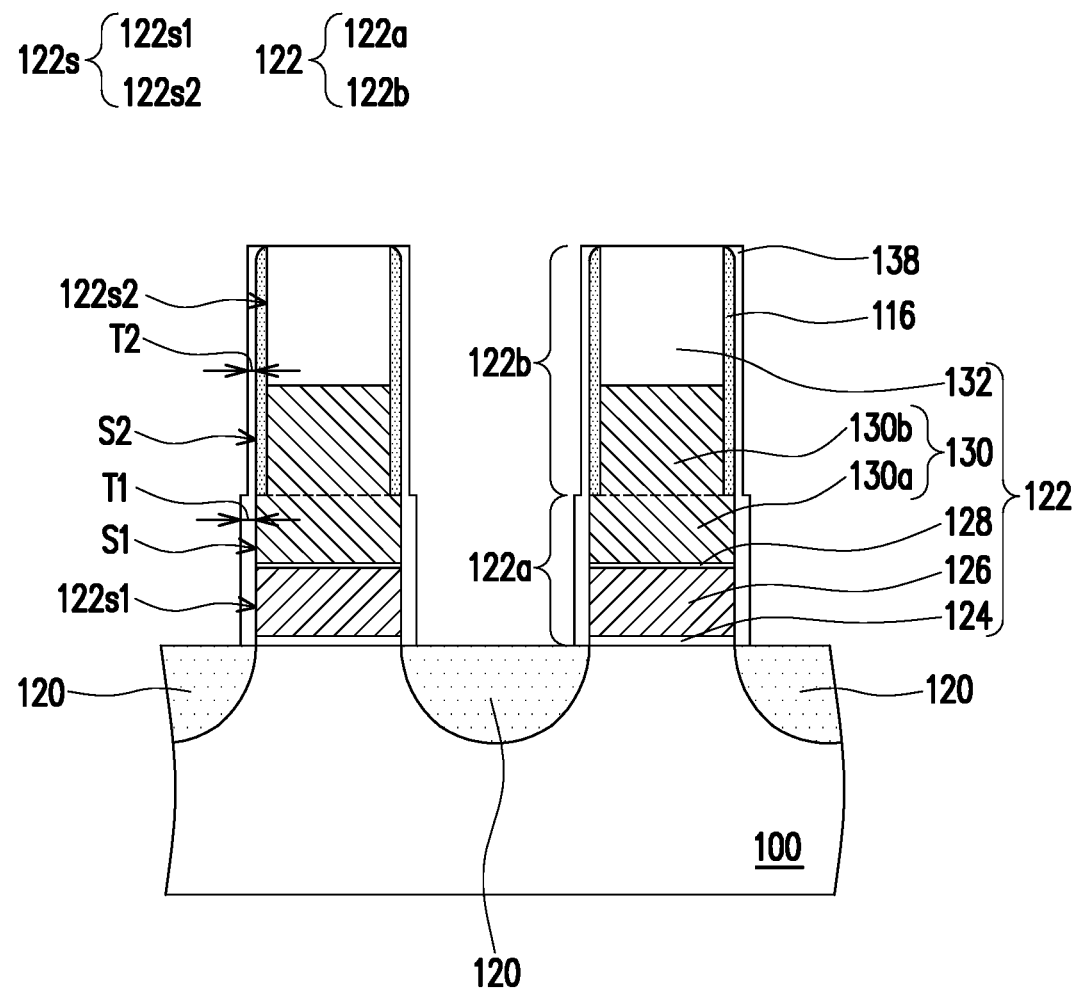
Figure 1E:
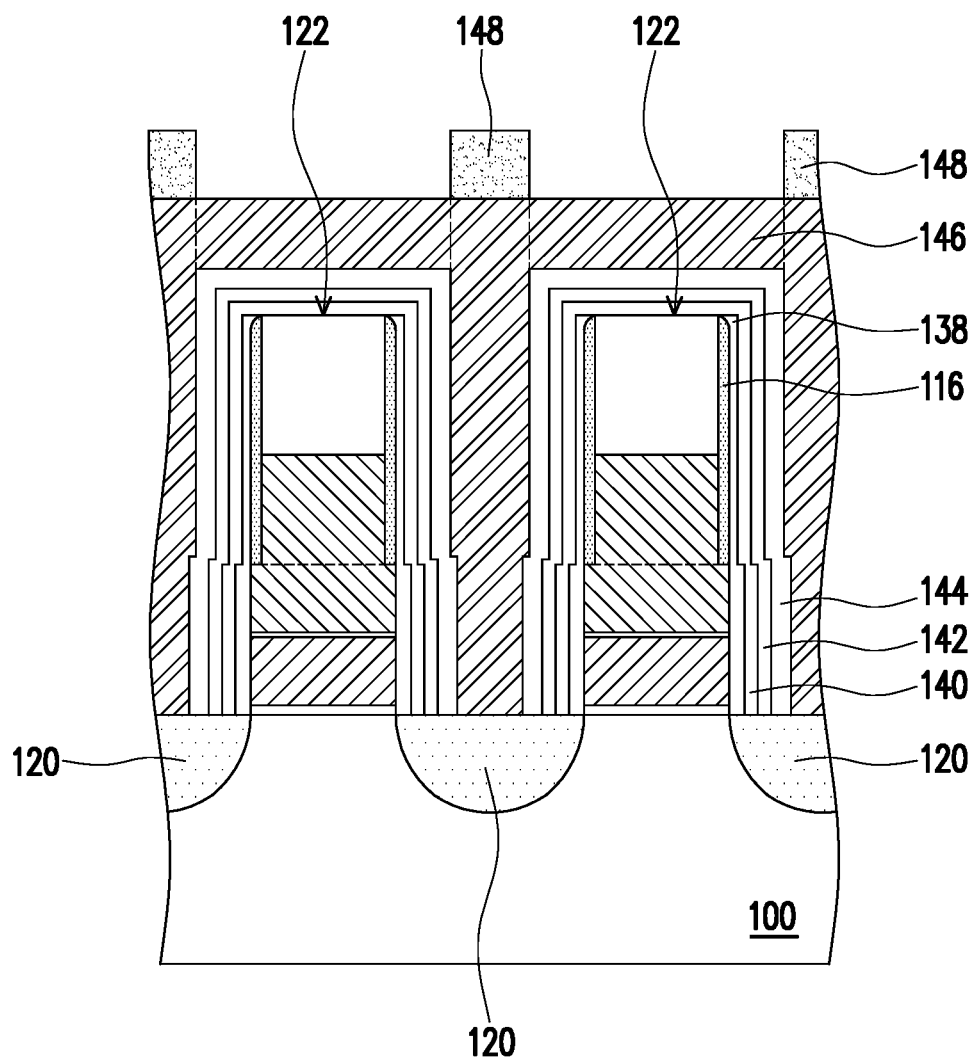
Figure 1F:
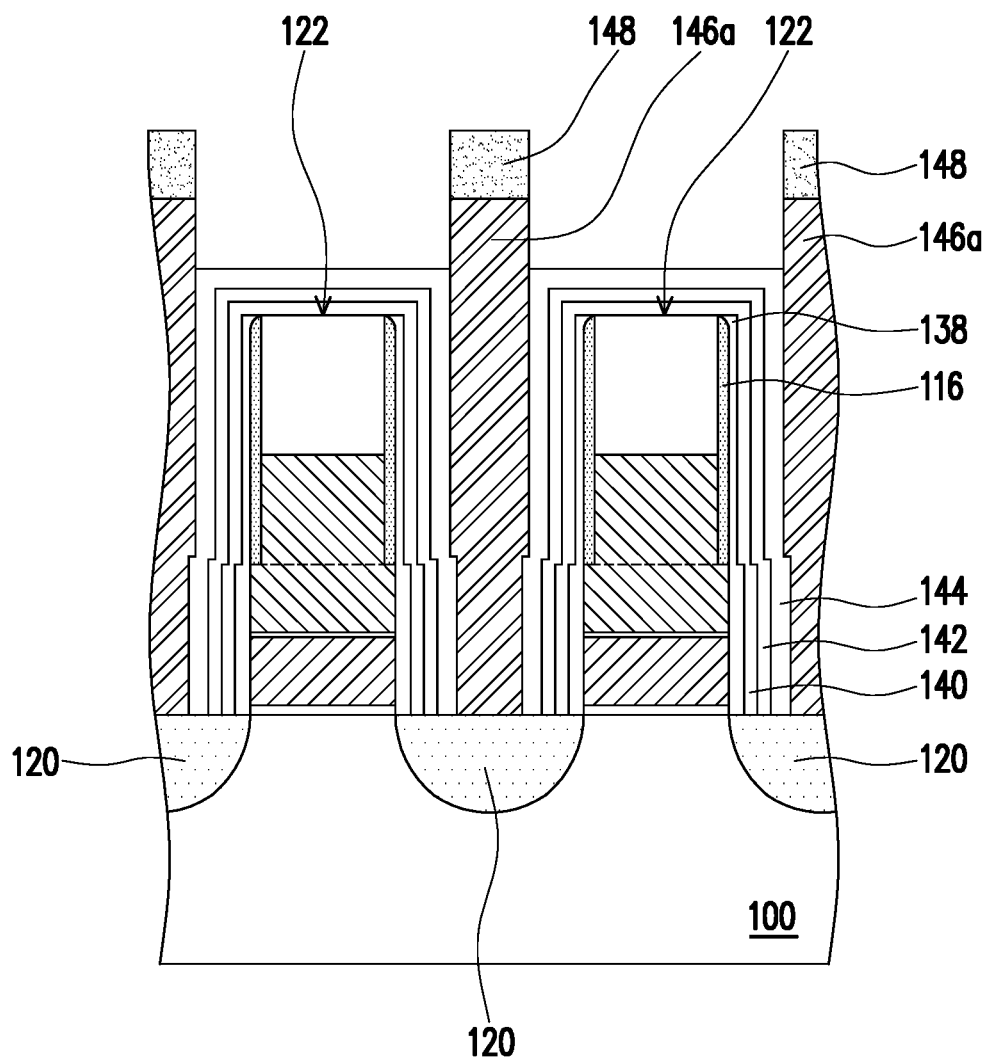
Figure 1G:
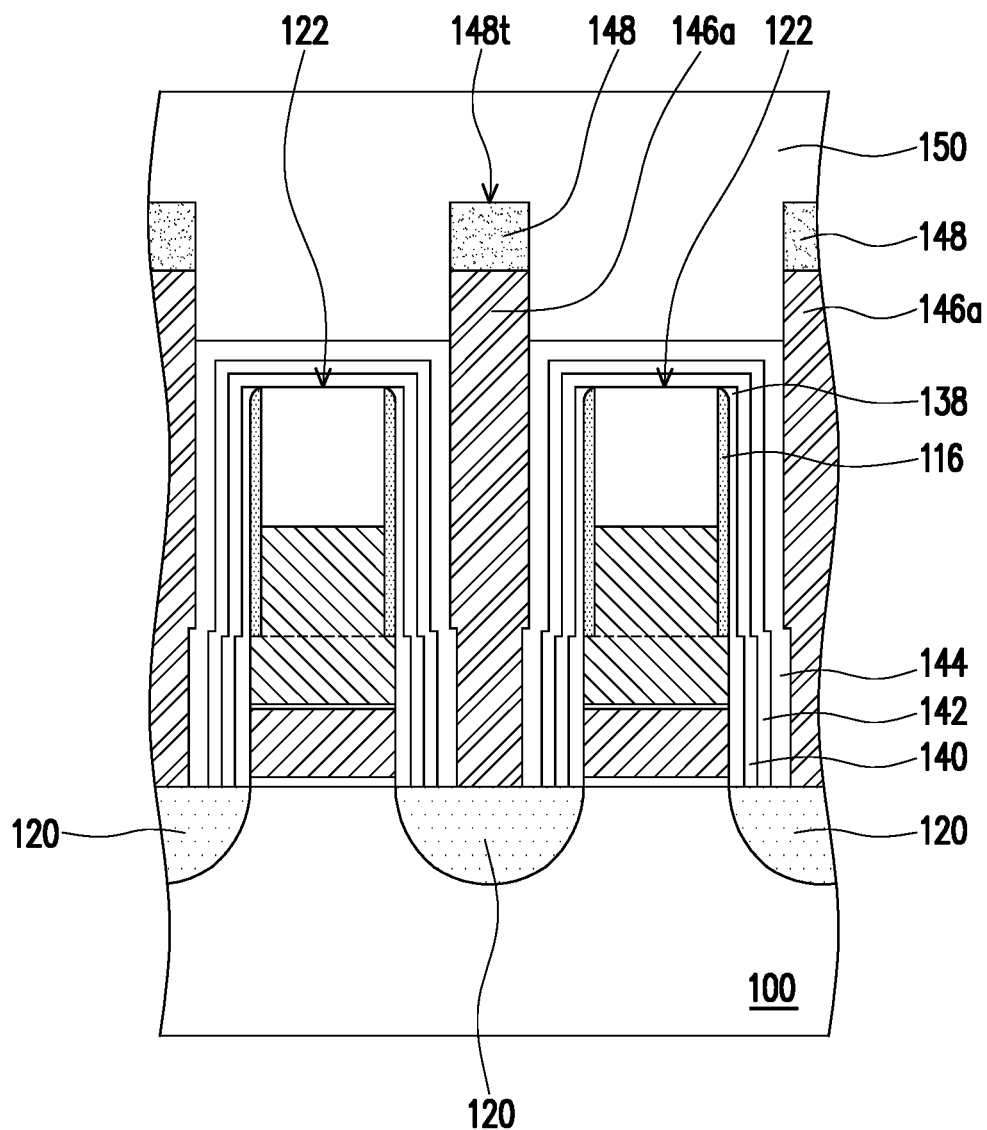
Figure 1H:
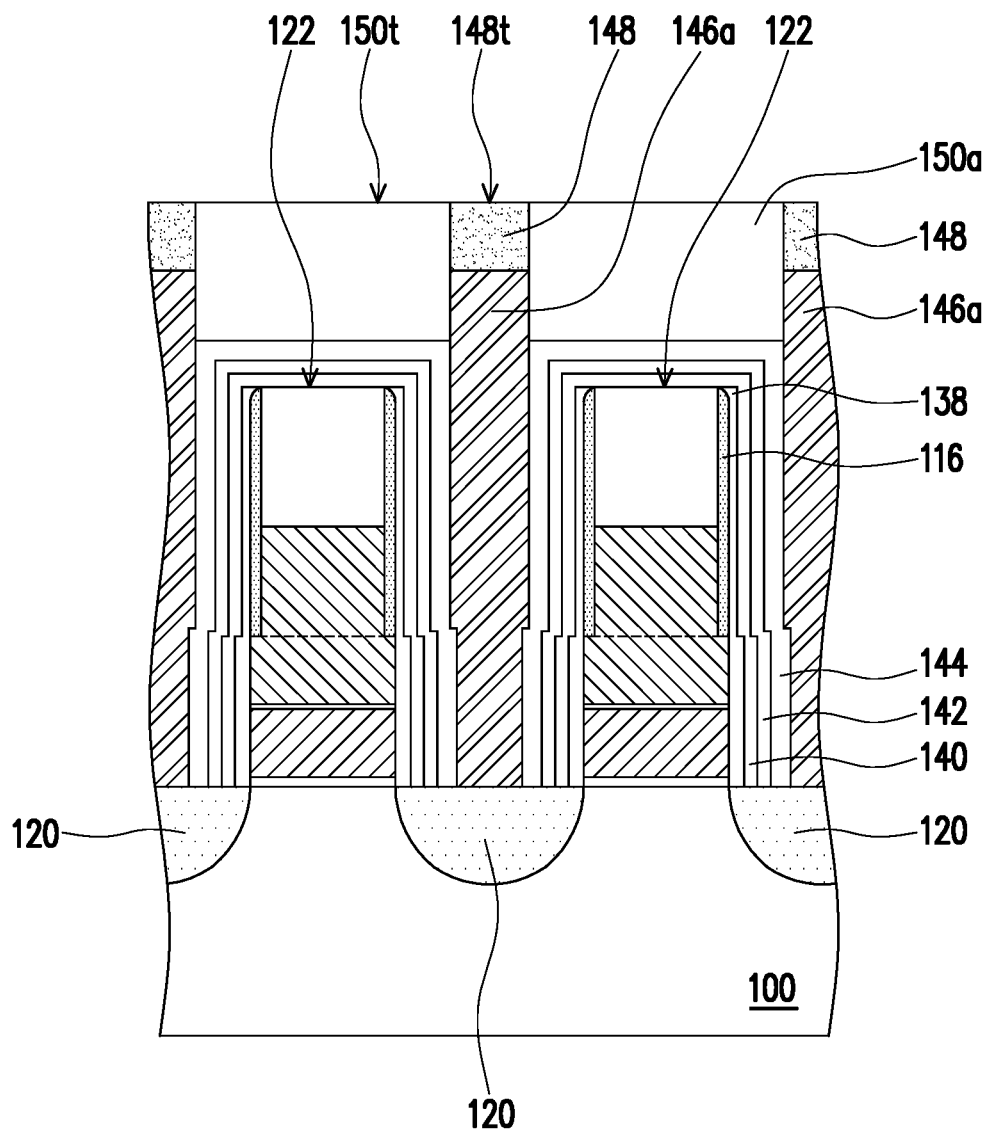
Figure 1I:
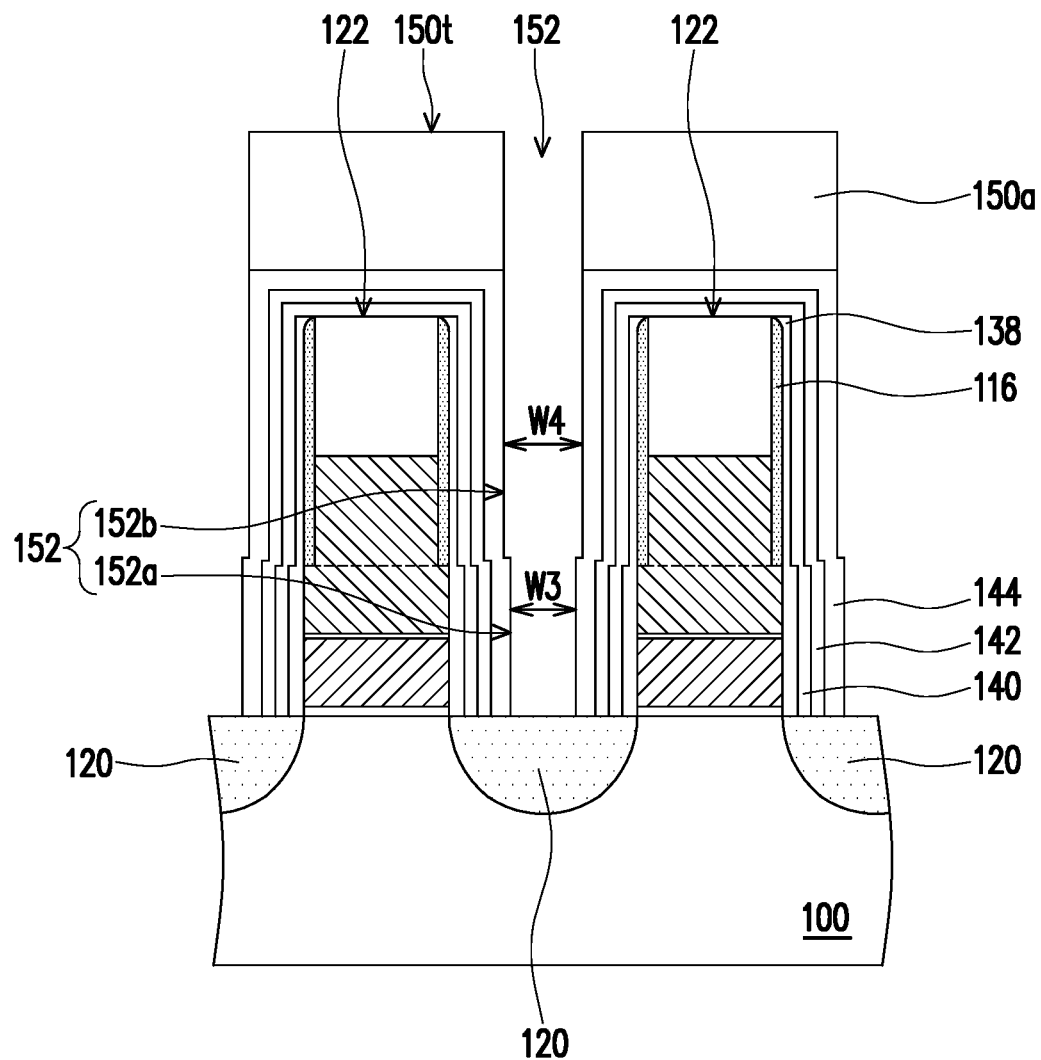
Figure 1J:
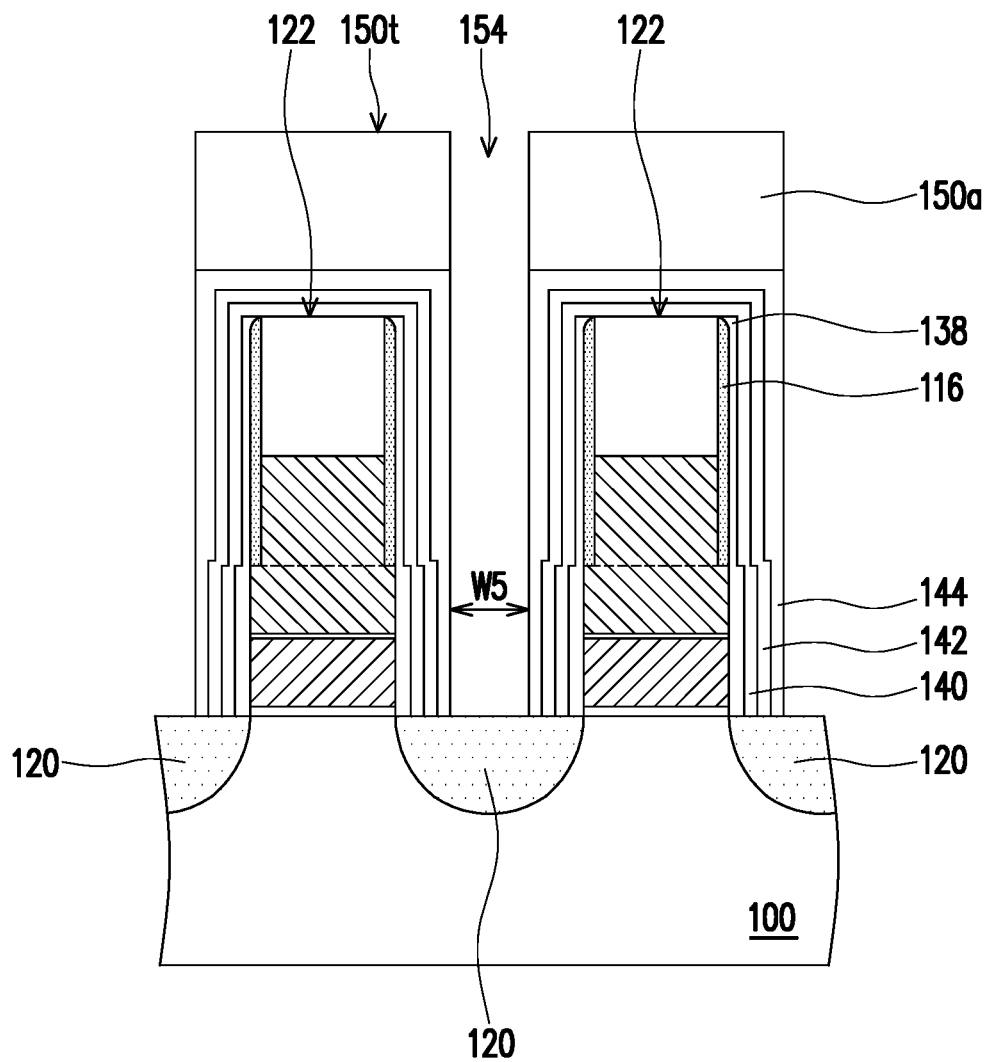
Figure 1K:
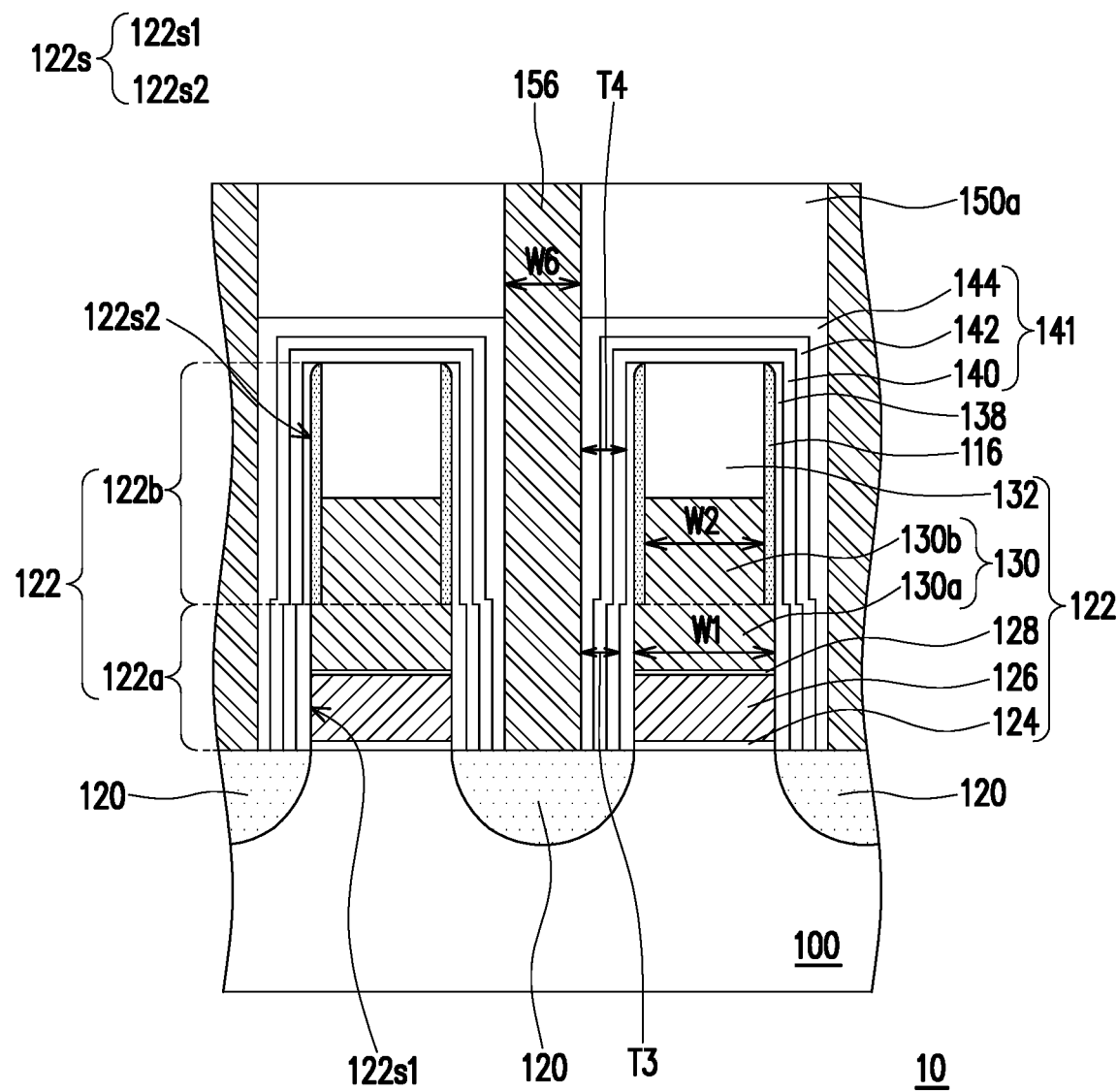

Referring to FIG. 1A, the present embodiment provides a manufacturing method of a memory device 10 (as shown in FIG. 1K) including following steps. First, an initial structure is provided that includes a substrate 100, a stacked layer 102, and a mask pattern 114. In an embodiment, the substrate 100 may be a semiconductor substrate, a semiconductor compound substrate, or a semiconductor-over-insulator (SOI) substrate, for instance. In the present embodiment, the substrate 100 may be a silicon substrate, and the cross section of FIG. 1A may be extended along the active areas, for example.

As shown in FIG. 1A, the stacked layer 102 is disposed on the substrate 100. Specifically, the stacked layer 102 includes, from bottom to top, a dielectric layer 104, a first conductive layer 106, a dielectric layer 108, a second conductive layer 110, and a cap layer 112. In an embodiment, the material of the dielectric layer 104 includes a dielectric material, which may be silicon oxide, silicon nitride, silicon oxynitride, a dielectric material having a high dielectric constant (k>4), or a combination thereof, for example. The material of the first conductive layer 106 includes a conductive material, which may be a metal material, polysilicon, or a combination thereof, for example.

The material of the dielectric layer 108 includes silicon oxide, silicon nitride, or a combination thereof, which may be a composite layer composed of oxide-nitride-oxide (ONO), for example. The material of the second conductive layer 110 includes a conductive material, which may be a metal material, polysilicon, or a combination thereof, for example. The material of the cap layer 112 includes a dielectric material, which may be silicon oxide, silicon nitride, silicon oxynitride, or a combination thereof, for example.

As shown in FIG. 1A, the mask pattern 114 is disposed on the stacked layer 102. In an embodiment, the material of the mask pattern 114 may be a suitable material, such as carbon, photoresist, or the like, for example.

Referring to FIG. 1A and FIG. 1B, the stacked layer 102 is patterned to form a plurality of openings 115 in the stacked layer 102. In detail, an etching process is performed with the mask pattern 114 as a mask to remove a portion of the cap layer 112 and a portion of the second conductive layer 110. Next, the mask pattern 114 is removed. In this case, as shown in FIG. 1B, the second conductive layer 110a includes a main body portion 110m and a protruding portion 110p located on the main body portion 110m. The protruding portion 110p is protruded from the top surface of the main body portion 110m, and the cap layer 112a is located on the protruding portion 110p.

As shown in FIG. 1B, a spacer 116 is formed on the sidewall of the openings 115. In some embodiments, the spacer 116 is formed by forming a spacer material (not shown) on the substrate 100, which conformally covers the surface of the cap layer 112a and the surface of the second conductive layer 110a, and an anisotropic etching process is then performed to remove a portion of the spacer material to expose the main body portion 110m. In an embodiment, the spacer material includes a dielectric material. In the present embodiment, the spacer material may be silicon nitride. In an alternate embodiment, a thickness 116t of the spacer 116 may be between 0 nm and 20 nm, such as about 5 nm.

Referring to FIG. 1B and FIG. 1C, a first etching process is performed with the spacer 116 as a mask to form a plurality of stack structures 122. In detail, in the first etching process, the second conductive layer 110a not covered by the cap layer 112a and the spacer 116 and the underlying dielectric layer 108, the underlying first conductive layer 106, and the underlying dielectric layer 104 are all removed to expose the substrate 100. In this case, the plurality of stack structures 122 are formed on the substrate 100, and the spacer 116 is formed on an upper sidewall 122s2 of the stack structures 122.

Specifically, as shown in FIG. 1C, one of the stack structures 122 includes a tunneling dielectric layer 124, a floating gate 126, an inter-gate dielectric layer 128, a control gate 130, and a cap layer 132 from bottom to top. The control gate 130 includes a lower portion 130a and an upper portion 130b. The spacer 116 covers the sidewall of the cap layer 132 and a sidewall S2 of the upper portion 130b. In an embodiment, a width W1 of the lower portion 130a is greater than a width W2 of the upper portion 130b, and the ratio (H1/H2) of a height H1 of the lower portion 130a to a height H2 of the upper portion 130b is about 0 to 2. However, the invention is not limited thereto. In other embodiments, the ratio of the height H1 to the height H2 (H1/H2) may be adjusted as needed.

From another point of view, one of the stack structures 122 is also divided into a lower portion 122a and an upper portion 122b, wherein the interface between the lower portion 122a and the upper portion 122b is the same as the interface between the lower portion 130a and the upper portion 130b. In some embodiments, the spacer 116 is embedded in the upper portion 122b of the stack structures 122, such that the width W2 of the upper portion 122b of the stack structures 122 is less than the width W1 of the lower portion 122a thereof. In an alternate embodiment, since the spacer 116 and the stack structures 122 are formed in the same etching process, a sidewall 116s of the spacer 116 is substantially coplanar with the sidewall S1 of the lower portion 130a of the control gate 130. In an alternate embodiment, the width W1 of the lower portion 130a is equal to the sum of the width W2 of the upper portion 130b and the thickness 116t of the spacer 116.

As shown in FIG. 1C, after the stack structures 122 are formed, a plurality of doped regions 120 are respectively formed in the substrate 100 between the stack structures 122. In an embodiment, the doped regions 120 have a conductivity type opposite to the substrate 100. For example, when the substrate 100 is doped of a P conductivity type, the doped regions 120 are doped of an N conductivity type; and vice versa. In the present embodiment, the doped regions 120 may be regarded as the source/drain (S/D) regions of the memory device, and the stack structures 122 may be regarded as the word line gate structures of the memory device. In another embodiment, a silicide layer (not shown) is further formed on the doped regions 120 to reduce the resistance value of the S/D regions.

Referring to FIG. 1D, an in-situ steam generation (ISSG) process is performed to form an oxide layer 138 on the sidewall 122s of the stack structures 122. In the present embodiment, the ISSG process may oxidize or repair the surface of the stack structures 122 damaged by an anisotropic etching process. In an embodiment, since the spacer 116 covers the sidewall 122s2 of the upper portion 122b of the stack structures 122, a thickness T1 of the oxide layer 138 located on the sidewall 122s1 of the lower portion 122a of the stack structures 122 is greater than a thickness T2 of the oxide layer 138 located on the sidewall 122s2 of the upper portion 122b of the stack structures 122, as shown in FIG. 1D. In another embodiment, the thickness T1 of the oxide layer 138 located on the sidewall S1 of the lower portion 130a of the control gate 130 is greater than the thickness T2 of the oxide layer 138 located on the sidewall S2 of the upper portion 130b of the control gate 130. In an alternate embodiment, the thickness T1 of the oxide layer 138 may be between 0 nm and 20 nm, for example, about 5 nm; and the thickness T2 of the oxide layer 138 may be between 0 nm and 10 nm, for example, about 1 nm.

Referring to FIG. 1D and FIG. 1E, dielectric layers 140, 142, and 144 are sequentially formed on the stack structures 122. The dielectric layers 140, 142, and 144 conformally cover the surface of the stack structures 122. In an embodiment, the dielectric layer 140 includes an oxide (e.g., silicon oxide), the dielectric layer 142 includes a nitride (e.g., silicon nitride), and the dielectric layer 144 includes an oxide (e.g., silicon oxide). The dielectric layers 140, 142, and 144 may be formed by a suitable forming method, such as a chemical vapor deposition method, an atomic layer deposition method, or the like. The thickness of the dielectric layer 140 may be between 0 nm and 20 nm, for example, about 5 nm; the thickness of the dielectric layer 142 may be between 0 nm and 20 nm, for example, about 10 nm; and the thickness of the dielectric layer 144 may be between 0 nm and 30 nm, for example, about 24 nm.

After the dielectric layers 140, 142, and 144 are formed, a first conductive material 146 is formed on the substrate 100 to be filled in the space between the stack structures 122 and cover the top surface of the stack structures 122. In some embodiments, the first conductive material 146 may be doped polysilicon, undoped polysilicon, or a combination thereof, for example.

Thereafter, a mask pattern 148 is formed on the first conductive material 146. As shown in FIG. 1E, the mask pattern 148 corresponds to the doped regions 120 between the stack structures 122. In some embodiments, the material of the mask pattern 148 may be a suitable material, such as carbon, photoresist, or the like, for example. In an alternate embodiment, the mask pattern 148 may be a hard mask layer that includes a silicon layer, a metal layer, a carbon layer, or a combination thereof.

Referring to FIG. 1E and FIG. 1F, the first conductive material 146 is patterned into a plurality of conductive layers 146a. In detail, a portion of the first conductive material 146 is removed by using the mask pattern 148 as a mask, so as to expose the dielectric layer 144 on the stack structures 122, thereby forming the conductive layers 146a. In this case, in an embodiment, the conductive layers 146a may be strip-shaped (in the top view), which may be dummy source contact plugs, for example. In another embodiment, the conductive layers 146a may be island structures (in the top view) or pillar structures (in the cross section), which may be dummy drain contact plugs, for example. Here, the so-called "dummy" refers to a structure removed by a subsequent replacement process.

Referring to FIG. 1G to FIG. 1K, a replacement process is performed to replace the conductive layers 146a with a plurality of contact plugs 156. Specifically, referring to FIG. 1G, a dielectric layer 150 is formed on the substrate 100. The dielectric layer 150 is filled in the space between the conductive layers 146a and covers a top surface 148t of the mask pattern 148. In some embodiments, the material of the dielectric layer 150 includes silicon oxide, silicon nitride, silicon oxynitride, spin on dielectric (SOD), or a combination thereof.

Referring to FIG. 1G and FIG. 1H, a planarization process is performed to remove a portion of the dielectric layer 150 to expose the top surface 148t of the mask pattern 148. In this case, the top surface 148t of the mask pattern 148 and a top surface 150t of a dielectric layer 150a may be considered to be coplanar.

Referring to FIG. 1H and FIG. 1I, a second etching process is performed to remove the mask pattern 148 and the conductive layers 146a underneath, so as to form a plurality of openings 152 (also referred to as contact openings) on the doped regions 120 between the stack structures 122. In some embodiments, the second etching process includes a first etching step and a second etching step. First, the first etching step is performed to remove the mask pattern 148, so as to expose the conductive layers 146a. Next, the second etching process is performed to remove the conductive layers 146a, so as to expose the substrate 100. In this case, as shown in FIG. 1I, the plurality of openings 152 are respectively formed on the doped regions 120 between the stack structures 122. In an embodiment, the openings 152 may be considered self-aligned openings since the forming of the openings 152 does not require any mask to be aligned with the doped regions 120. One of the self-aligned openings 152 includes a lower portion opening 152a and an upper portion opening 152b. In the present embodiment, as shown in FIG. 1I, a width W4 of the upper portion opening 152b is greater than a width W3 of the lower portion opening 152a. This difference in width is due to the difference in thickness of the oxide layer 138. The opening 152 with a wider top and narrower bottom facilitate the forming of the subsequent contact plugs 156.

In some embodiments, since the mask pattern 148 and the conductive layers 146a have different materials, the first etching step and the second etching step include a dry etching process having different etching gases for etching or a wet etching process having different etching solutions for etching. Specifically, in the first etching step, the mask pattern 148 has a high etching selectivity ratio with the dielectric layer 150a and the conductive layers 146a. That is, during the first etching step, the mask pattern 148 is removed or completely removed, and only a small amount of the dielectric layer 150a and the conductive layers 146a is removed. Similarly, in the second etching step, the conductive layers 146a and the dielectric layer 150a also have a high etch selectivity ratio. That is, during the second etching step, the conductive layers 146a are removed or completely removed, and only a small amount of the dielectric layer 150a is removed.

It should be noted that, in the present embodiment, the spacer 116 and the dielectric layer 142 both composed of silicon nitride are used to achieve dual protection. In particular, even if an overlap shift is occurred in the forming of the mask pattern 148, the stack structures 122 (especially the upper portion 122b) may still be protected from damaged by the second etching process, so as to maintain the integrity of the stack structures 122, thereby increasing the reliability. In other words, in the present embodiment, the process margin during the replacement process (especially the second etching process) may be increased. Additionally, as shown in FIG. 1I, the opening 152 with a wider top and a narrower bottom facilitate the complete removal of the conductive layers 146a, particularly removing the conductive layers 146a in the lower portion opening 152a.

Referring to FIG. 1I and FIG. 1J, a trimming process is performed to remove a portion of the dielectric layer 144 at both sides of the lower portion opening 152a, thereby widening the lower portion opening 152a. In this case, as shown in FIG. 1J, a trimmed opening 154 has a uniform width W5. That is, from the cross section, the opening 154 may be a rectangle having a sidewall substantially perpendicular to the top surface of the substrate 100. In an embodiment, the width W5 of the openings 154 may be greater than or equal to the width W4 of the upper portion opening 152b. In some embodiments, the trimming process includes a dry etching process, such as a reactive ion etching (RIE) process.

Referring to FIG. 1J and FIG. 1K, a second conductive material is filled in the openings 154 to form a plurality of contact plugs 156, thereby accomplishing the memory device 10 of the present embodiment. In an embodiment, the second conductive material is different from the first conductive material 146. In another embodiment, the second conductive material includes a metal material (for example, W, Cu, AlCu, etc.), a barrier metal (for example, Ti, TiN, Ta, TaN, etc.), or a combination thereof, and may be formed by a suitable forming method, such as electroplating, physical vapor deposition (PVD), or chemical vapor deposition. In the present embodiment, the contact plugs 156 may be considered as self-aligned contact plugs since the forming of the contact plugs 156 does not require any mask to be aligned with the doped regions 120. In an alternate embodiment, as shown in FIG. 1K, one of the self-aligned contact plugs 156 has a uniform width W6, which may be between 0 nm and 80 nm, such as 40 nm.

Referring to FIG. 1K, the memory device 10 of the present embodiment includes a substrate 100, a plurality of stack structures 122, a spacer 116, an oxide layer 138, dielectric layers 140, 142, 144, and 150a, and a plurality of contact plugs 156. The stack structures 122 are disposed on the substrate 100. The spacer 116 is embedded in the stack structures 122, such that a width W2 of an upper portion 122b of the stack structures 122 is less than a width W1 of a lower portion 122a thereof. The dielectric layers 140, 142, and 144 conformally cover the stack structures 122 and the spacer 116. Hereinafter, the three dielectric layers 140, 142, and 144 are regarded as one entire dielectric layer 141. The oxide layer 116 is disposed between the lower portion 122a of the stack structures 122 and the dielectric layer 141 and is extended between the spacer 116 and the dielectric layer 141. The contact plugs 156 are respectively disposed on the substrate 100 between the stack structures 122.

In some embodiments, a thickness T1 of the oxide layer 138 located on a sidewall 122s1 of the lower portion 122a of the stack structures 122 is greater than a thickness T2 of the oxide layer 138 located on a sidewall 122s2 of the upper portion 122b of the stack structures 122, as shown in FIG. 1D. In this case, a thickness T4 of the dielectric layer 141 located on the sidewall 122s2 of the upper portion 122b of the stack structures 122 is greater than the thickness T3 of the dielectric layer 141 located on the sidewall 122s1 of the lower portion 122a of the stack structures 122. That is, when a width W6 of the contact plugs 156 is constant, the thicker dielectric layer 141 covers the sidewall 122s2 of the upper portion 122b of the stack structures 122, which enhances the protection of the upper portion 122b of the stack structures 122 to prevent damage from the second etching process, thereby maintaining the integrity of the stack structures 122.

Based on the above, in the invention, the spacer is embedded in the stack structures, and the dielectric layer is then formed to conformally cover the stack structures. In this case, the spacer and the dielectric layer may form a dual protection to increase the protection of the upper portion of the stack structures, thereby improving the process margin during a gate replacement process.

What is claimed is:

1. A manufacturing method of a memory device, comprising:
   forming a stacked layer on a substrate;
   patterning the stacked layer to form a plurality of openings in the stacked layer;
   forming a spacer on a sidewall of the openings;
   performing a first etching process by using the spacer as a mask to form a plurality of stack structures, wherein the spacer is embedded in the stack structures, such that a width of an upper portion of the stack structures is less than a width of a lower portion thereof;
   forming a dielectric layer on the stack structures and the spacer; and
   respectively forming a plurality of contact plugs on the substrate between the stack structures, wherein the steps of forming the contact plugs comprises:
      forming a first conductive material on the substrate to be filled in a space between the stack structures;
      patterning the first conductive material into a plurality of conductive layers; and
      performing a replacement process to replace the conductive layers with the contact plugs.

2. The manufacturing method of the memory device of claim 1, wherein each stack structure at least comprises:
   a tunneling dielectric layer disposed on the substrate;
   a floating gate disposed on the tunneling dielectric layer;
   an inter-gate dielectric layer disposed on the floating gate; and
   a control gate disposed on the inter-gate dielectric layer, wherein the control gate comprises a lower portion and an upper portion on the lower portion, and the lower portion of the control gate has a width greater than a width of the upper portion of the control gate, wherein the upper portion covers a first portion of a top surface of the lower portion and exposes a second portion of the top surface of the lower portion.

3. The manufacturing method of the memory device of claim 2, wherein after forming the plurality of stack structures, the spacer is disposed on the second portion of the top surface of the lower portion of the control gate and covers a sidewall of the upper portion of the control gate.

4. The manufacturing method of the memory device of claim 2, wherein after forming the plurality of stack structures, the spacer has an inner sidewall and an outer sidewall opposite to each other, the inner sidewall is in direct contact with the sidewall of the upper portion of the control gate, and the outer sidewall is level with a sidewall of the lower portion of the control gate.

5. The manufacturing method of the memory device of claim 4, wherein the sidewall of the lower portion of the control gate is substantially coplanar with a sidewall of the inter-gate dielectric layer, the floating gate and the dielectric layer.

6. The manufacturing method of the memory device of claim 4, wherein before the dielectric layer is formed, the manufacturing method further comprises:
   performing an in-situ steam generation process to form an oxide layer on a sidewall of the stack structures, wherein a thickness of the oxide layer located on a sidewall of the upper portion of the stack structures is less than a thickness of the oxide layer located on a sidewall of the lower portion of the stack structures.

7. The manufacturing method of the memory device of claim 6, wherein the oxide layer covers and directly contacts the outer sidewall of the spacer and the sidewall of the lower portion of the control gate, and not covers a top surface of the plurality of stack structures.

8. The manufacturing method of the memory device of claim 1, wherein the plurality of conductive layers comprise dummy source contact plugs with strip-shaped structures.

9. The manufacturing method of the memory device of claim 1, wherein the plurality of conductive layers comprise dummy drain contact plugs with island structures.

10. The manufacturing method of the memory device of claim 1, wherein the replacement process comprises:
    performing a second etching process to remove the conductive layers, so as to respectively form a plurality of contact openings between the stack structures, wherein the contact openings expose the substrate; and
    filling a second conductive material in the contact openings to form the plurality of contact plugs.

11. The manufacturing method of the memory device of claim 10, wherein the second etching process comprises a first etching step and a second etching step using different etching gases.

12. The manufacturing method of the memory device of claim 10, wherein the first conductive material is different from the second conductive material.

13. The manufacturing method of the memory device of claim 12, wherein the first conductive material comprises a polysilicon material, and the second conductive material comprises a metal material, a barrier metal, or a combination thereof.

14. The manufacturing method of the memory device of claim 10, wherein before filling the second conductive material in the contact openings, the method further comprises: performing a trimming process, so that the contact openings have a uniform width.

15. The manufacturing method of the memory device of claim 14, wherein the trimming process comprises a reactive ion etching (RIE) process.

16. The manufacturing method of the memory device of claim 1, wherein a material of the spacer is silicon nitride.

17. The manufacturing method of the memory device of claim 1, wherein a thickness of the dielectric layer located on a sidewall of the upper portion of the stack structures is greater than a thickness of the dielectric layer located on a sidewall of the lower portion of the stack structures.

\* \* \* \* \*